United States Patent
Ren et al.

(10) Patent No.: US 12,057,502 B1
(45) Date of Patent: Aug. 6, 2024

(54) SILICON-ON-INSULATOR METAL-OXIDE-SEMICONDUCTOR FIELD-EFFECT TRANSISTOR (SOI MOSFET) STRUCTURE

(71) Applicant: Anhui University, Hefei (CN)

(72) Inventors: Xingang Ren, Hefei (CN); Wei Zhi, Hefei (CN); Huping Ju, Hefei (CN); Zhixiang Huang, Hefei (CN); Gang Wang, Hefei (CN); Kaikun Niu, Hefei (CN); Siliang Wang, Hefei (CN); Yingsong Li, Hefei (CN); Xianliang Wu, Hefei (CN); Sungen Cao, Hefei (CN)

(73) Assignee: Anhui University, Hefei (CN)

( * ) Notice: Subject to any disclaimer, the term of this patent is extended or adjusted under 35 U.S.C. 154(b) by 0 days.

(21) Appl. No.: 18/618,750

(22) Filed: Mar. 27, 2024

(30) Foreign Application Priority Data

Jun. 14, 2023 (CN) .......................... 202310702671.1

(51) Int. Cl.
*H01L 29/78* (2006.01)
*H01L 23/373* (2006.01)
*H01L 29/06* (2006.01)

(52) U.S. Cl.
CPC ...... *H01L 29/7824* (2013.01); *H01L 23/3738* (2013.01); *H01L 29/0607* (2013.01)

(58) Field of Classification Search
CPC ............... H01L 23/367; H01L 23/3677; H01L 29/7824; H01L 29/7816; H01L 29/42364; H01L 29/42368; H01L 29/42372; H01L 29/42384; H01L 29/66681
See application file for complete search history.

(56) References Cited

U.S. PATENT DOCUMENTS

2007/0001262 A1* 1/2007 Ouyang .............. H01L 27/1203
257/565
2014/0191322 A1 7/2014 Botula et al.

FOREIGN PATENT DOCUMENTS

| CN | 103762229 | A |   | 4/2014 |
| CN | 104637989 | A |   | 5/2015 |
| CN | 104810334 | A |   | 7/2015 |
| CN | 115863423 | A | * | 3/2023 |
| CN | 116169171 | A |   | 5/2023 |
| EP | 1120835   | A2 |  | 8/2001 |

* cited by examiner

*Primary Examiner* — Raj R Gupta

(57) ABSTRACT

A silicon-on-insulator metal-oxide-semiconductor field-effect transistor (SOI MOSFET) structure is provided, including a substrate layer; a buried oxide layer which is arranged on an upper surface of the substrate layer and is made of $SiO_2$; an active zone which is arranged on an upper surface of the buried oxide layer; a source electrode and a drain electrode which are arranged on an upper surface of the active zone; a gate dielectric layer which is arranged between the source electrode and the drain electrode; a gate electrode which is provided in the gate dielectric layer; and a heat conduction column which penetrates through the buried oxide layer, and its top wall is in contact with the active zone. The heat conduction column dissipates heat in the active zone, resulting in a lattice temperature of the active zone will not increase extremely and avoiding a decrease of a current of the drain electrode.

7 Claims, 12 Drawing Sheets

SILICON-ON-INSULATOR METAL-OXIDE-SEMICONDUCTOR FIELD-EFFECT TRANSISTOR (SOI MOSFET) STRUCTURE

CROSS-REFERENCE TO RELATED APPLICATIONS

This application claims the benefit of priority from Chinese Patent Application No. 202310702671.1, filed on Jun. 14, 2023. The content of the aforementioned application, including any intervening amendments thereto, is incorporated herein by reference in its entirety.

TECHNICAL FIELD

This application relates to integrated circuit chip-based electronic devices, and more particularly to a silicon-on-insulator metal-oxide-semiconductor field-effect transistor (SOI MOSFET) structure.

BACKGROUND

With the reduction of device size, integrated circuits are becoming more and more miniaturized. The existing traditional complementary metal-oxide-semiconductor (CMOS) technology is approaching its physical limit, and cannot meet the high-performance requirements of very large-scale integration (VLSI). Silicon-on-insulator metal-oxide-semiconductor field-effect transistor (SOI MOSFET) is a MOSFET device prepared based on SOI technology. An isolation layer is added between a source region, a drain region and a substrate of the SOI MOSFET to form a full dielectric isolation similar to a sandwich structure, which can overcome disadvantages of silicon materials and maximize the potential of silicon integrated circuits. Compared to the conventional MOSFET, the SOI MOSFET has better radiation resistance, lower leakage current, and lower power consumption, and is widely used in the VLSI.

However, the SOI MOSFET is limited to a unique buried oxide layer structure (a $SiO_2$ layer is added on an upper surface of a Si substrate), resulting in sharpening self-heating effect of the device. When the SOI MOSFET or the MOSFET is working, electrons in the channel region will accelerate to drift and have lattice collision under high electric field, resulting in heat transfer between the electrons and lattices. Because the Si substrate of the SOI MOSFET has the $SiO_2$ layer, and a heat conductivity of $SiO_2$ is only 1% of a heat conductivity of Si, heat of an active zone of the SOI MOSFET cannot be transferred through the substrate. A lot of heat is concentrated in the active zone, which extremely increases a lattice temperature of the active zone, resulting in decrease of a current of the drain electrode and serious performance problems of devices.

SUMMARY

In view of the above problems, this application is to provide a silicon-on-insulator metal-oxide-semiconductor field-effect transistor (SOI MOSFET) structure to decrease self-heating effects.

In order to achieve the above objectives, the present disclosure provides an SOI MOSFET structure, comprising:
a substrate layer;
a buried oxide layer;
an active zone;
a source electrode;
a drain electrode;
a gate dielectric layer;
a gate electrode; and
a heat conduction column;
wherein the buried oxide layer is arranged on an upper surface of the substrate layer, and is made of $SiO_2$; the active zone is arranged on an upper surface of the buried oxide layer; the source electrode and the drain electrode are arranged on an upper surface of the active zone, and the source electrode is spaced from the drain electrode; the gate dielectric layer is arranged on the upper surface of the active zone; a first end of the gate dielectric layer is connected to the source electrode, and a second end of the gate dielectric layer is connected to the drain electrode; the gate electrode is provided in the gate dielectric layer, and is not in contact with the source electrode and the drain electrode; the heat conduction column penetrates through the buried oxide layer; a top wall of the heat conduction column is in contact with the active zone, and a bottom wall of the heat conduction column extends into the substrate layer; the gate electrode has a cuboid structure; a side of a bottom end of the gate electrode close to the drain electrode is provided with a notch, and the notch penetrates through the gate electrode.

In an embodiment, the heat conduction column is made of an III-V compound semiconductor material.

In an embodiment, the heat conduction column is made of SiC, GaN, InN or AlN.

In an embodiment, two ends of the heat conduction column are configured to respectively extend out of the buried oxide layer to pass through an isolation layer to be connected to a heat conduction column of another device.

In an embodiment, a central axis of the heat conduction column is located directly below a side wall of the gate electrode close to the drain electrode, and is located at the same vertical line with the side wall of the gate electrode close to the drain electrode.

In an embodiment, the notch comprises an upper bottom surface, a first side surface, a lower bottom surface, and a second side surface connected in sequence; the upper bottom surface of the notch is parallel to the lower bottom surface of the notch; the first side surface of the notch is a side of the notch close to the drain electrode, and the second side surface of the notch is a side of the notch close to the source electrode; a length of the lower bottom surface of the notch is denoted as $t_1$, a length of the upper bottom surface of the notch is denoted as $t_2$, and a height of the notch is denoted as $t_3$; an angle between the second side surface of the notch and the lower bottom surface of the notch is denoted as $\theta$, and the $\theta$ is expressed as: $\theta = \arctan(t_3/(t_1-t_2))$, and is not greater than 90°.

In an embodiment, the active zone comprises a first N-type heavily doped region, a P-type doped region and a second N-type heavily doped region connected in sequence; the first N-type heavily doped region is located below the source electrode and the gate dielectric layer; the second N-type heavily doped region is located below the drain electrode and the gate dielectric layer; the P-type doped region is located below the gate dielectric layer; the first N-type heavily doped region and the second N-type heavily doped region are independently formed by a first N-type semiconductor, wherein the first N-type semiconductor is made of a pentavalent element-doped silicon material; and the P-type doped region is formed by a P-type semiconductor wherein the P-type semiconductor is made of a trivalent element-doped silicon material.

In an embodiment, an N-type lightly doped region is provided in the P-type doped region; the N-type lightly doped region is in contact with the gate dielectric layer; the N-type lightly doped region is formed by a second N-type semiconductor; and a pentavalent element doping level in the N-type lightly doped region is lower than that in the first N-type heavily doped region and the second N-type heavily doped region.

The present disclosure has the following beneficial effects.

When the SOI MOSFET is working, electrons in a channel region will accelerate to drift and have lattice collision under a high electric field, resulting in heat transfer between the electrons and lattices. Heat in the active zone of the prior art can only be slightly dissipated from a side or from above the active zone. Owing to poor heat conductivity of a $SiO_2$ buried oxide layer below the active zone, the heat of the active zone cannot be dissipated through the $SiO_2$ buried oxide layer below the active zone. However, the present disclosure provides the heat conduction column. The heat conduction column penetrates through the buried oxide layer, and the top wall of the heat conduction column is in contact with the active zone, so that the heat in the active zone can be dissipated through the heat conduction column below the active zone, and a lattice temperature of the active zone will not increase extremely, which avoids decrease of a current of the drain electrode.

BRIEF DESCRIPTION OF THE DRAWINGS

To clearly describe technical schemes of embodiments of the present disclosure or the prior art, accompanying drawings needed in the description of embodiments or the prior art will be briefly introduced below. It is obvious that presented in the accompanying drawings are only some embodiments of the present disclosure, and those skilled in the art can obtain other drawings according to these accompanying drawings without any creative effort.

Figure 1:
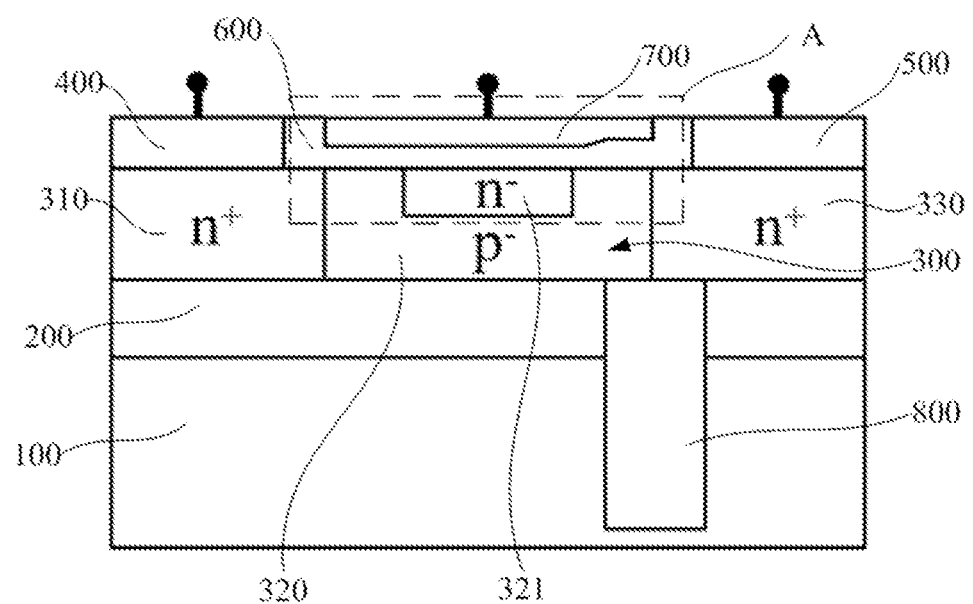
FIG. 1 schematically shows a silicon-on-insulator metal-oxide-semiconductor field-effect transistor (SOI MOSFET) structure according to an embodiment of the present disclosure.

In the figures: 100, substrate layer; 200, buried oxide layer; 300, active zone; 310, first N-type heavily doped region; 320, P-type doped region; 321, N-type lightly doped region; 330, second N-type heavily doped region; 400, source electrode; 500, drain electrode; 600, gate dielectric layer; 700, gate electrode; 710, notch; and 800, heat conduction column.

Control represents a standard device, which is a conventional SOI MOSFET device of the prior art; SG-MOS represents an SOI MOSFET device with an inclined gate structure; SG-D-MOS represents an SOI MOSFET device with the inclined gate structure and a lightly doped channel; SG-D-SiC-MOS represents an SOI MOSFET device with the inclined gate structure, the lightly doped channel and a heat conduction column; VG represents a gate voltage during simulation; $t_1$ represents a length of a lower bottom surface of the notch 710; $t_2$ represents a length of an upper bottom surface of the notch 710; $t_3$ represents a height of the notch 710; and θ represents an angle between a second side surface of the notch 710 and the lower bottom surface of the notch 710.

The objectives, functional characteristics and advantages of the present disclosure will be further described below with reference to the embodiments and the accompanying drawings.

DETAILED DESCRIPTION OF EMBODIMENTS

The present disclosure will be clearly and completely described below with reference to the accompanying drawings and embodiments. It should be understood that the embodiments described herein are only part of embodiments of the present disclosure. Based on the embodiments of the present disclosure, other embodiments obtained by those skilled in the art without paying creative effort shall fall within the scope of this application.

It should be noted that as used herein, the orientation or position relationship indicated by the terms "up", "down", "left", "right", "front", and "back", is based on the orientation or position relationship shown in the accompanying drawings, and are only for facilitating and simplifying the description rather than indicating or implying that the devices or components must have a particular orientation, or be constructed and operated in a particular orientation, therefore, they cannot be understood as a limitation of this application. Besides, the terms "first" and "second" are only used for description, and can't be understood as indicating or implying relative importance, or implying and indicating the number of referred technical features. Therefore, a feature defined with "first" or "second" may explicitly or implicitly includes at least one of the features. In addition, the term "and/or" used herein includes three schemes, for example, "A" and/or "B" includes solution "A", solution "B", and a combination thereof. Technical solutions of embodiments can be combined with each other as long as the combined solution can be implemented by those skilled in the art. When a combination of the technical solutions is contradictory or cannot be realized, it should be considered that such a combination does not exist and is not within the scope of the present disclosure.

Figure 2:
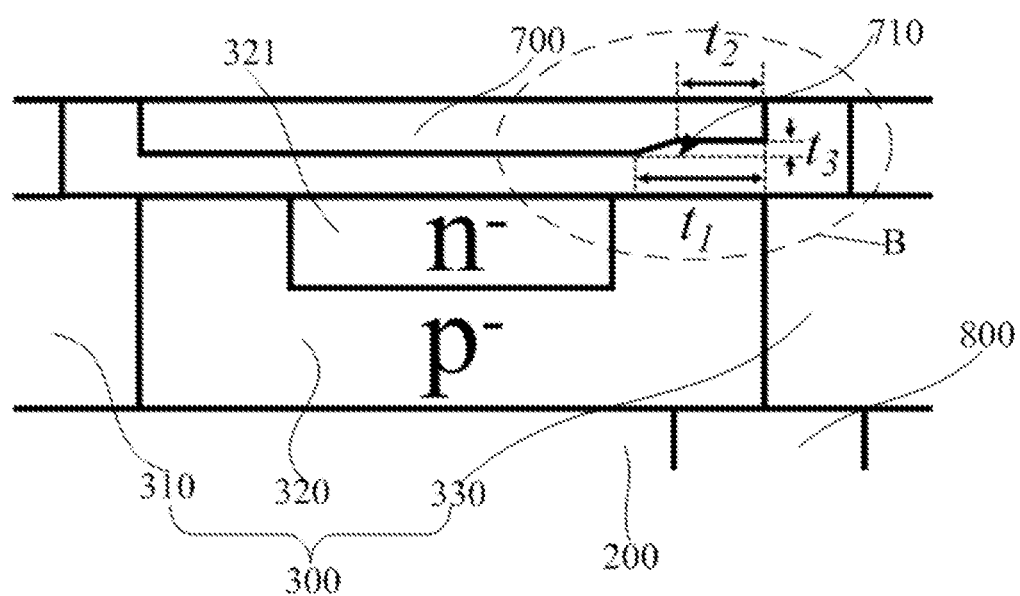
FIG. 2 is an enlarged view of portion "A" in FIG. 1.

Referring to FIGS. 1-2, the present disclosure provides a silicon-on-insulator metal-oxide-semiconductor field-effect transistor (SOI MOSFET) structure, including a substrate layer 100, a buried oxide layer 200, an active zone 300, a source electrode 400, a drain electrode 500, a gate dielectric layer 600, a gate electrode 700, and a heat conduction column 800. The buried oxide layer 200 is arranged on an upper surface of the substrate layer 100, and the buried oxide layer 200 is made of $SiO_2$. The active zone 300 is arranged on an upper surface of the buried oxide layer 200. The source electrode 400 and the drain electrode 500 are arranged on an upper surface of the active zone 300, and the source electrode 400 is spaced from the drain electrode 500. The gate dielectric layer 600 is arranged on the upper surface of the active zone 300, and is located between the source electrode 400 and the drain electrode 500. A first end of the gate dielectric layer 600 is connected to the source electrode 400, and a second end of the gate dielectric layer 600 is connected to the drain electrode 500. The gate electrode 700 is provided in the gate dielectric layer 600, and is not in contact with the source electrode 400 and the drain electrode 500. The heat conduction column 800 penetrates through the buried oxide layer 200. A top wall of the heat conduction column 800 is in contact with the active zone 300, and a bottom wall of the heat conduction column 800 extends into the substrate layer 100. The gate electrode 700 has a cuboid structure. A side of a bottom end of the gate electrode 700 close to the drain electrode 500 is provided with a notch 710, and the notch 710 penetrates through the gate electrode 700.

When an SOI MOSFET device is working, electrons in a channel region of the active zone 300 will accelerate to drift and have lattice collision under a high electric field, resulting in heat transfer between the electrons and lattices. Heat in the active zone 300 of the prior art can only be slightly dissipated from a side or from above the active zone 300. Owing to a poor heat conductivity of a $SiO_2$ buried oxide layer 200 below the active zone 300, the heat of the active zone 300 cannot be dissipated through the $SiO_2$ buried oxide layer 200 below the active zone 300. However, the present disclosure provides the heat conduction column 800. The heat conduction column 800 penetrates through the buried oxide layer 200, and the top wall of the heat conduction column 800 is in contact with the active zone 300, so that the heat in the active zone 300 can be dissipated through the heat conduction column 800 below the active zone 300, and a lattice temperature of the active zone 300 will not increase extremely, which avoids decrease of a current of the drain electrode 500. In an embodiment, the bottom wall of the heat conduction column 800 extends into the substrate layer 100, so that the heat in the active zone 300 can be directly dissipated through the heat conduction column 800 below the active zone 300, and can be dissipated through the heat conduction column 800 below the active zone 300 and the substrate layer 100, which is another way to dissipate the heat to make heat dissipation more reliable.

In an embodiment, the side of the bottom end of the gate electrode 700 close to the drain electrode 500 is provided with the notch 710. The notch 710, from a side face close to the drain electrode 500, extends to a side face close to the source electrode 400, and extends from a lower bottom surface of the notch 710 to an upper bottom surface of the notch 710. And the notch 710 penetrates through the gate electrode 700. In an embodiment, such setting of the notch 710 can reduce heat production of the active zone 300 of the SOI MOSFET structure. An electric field on a channel of the SOI MOSFET will decrease because of an inclined gate structure (that is, the notch 710 of the gate electrode 700), resulting in reduction of joule heat generation inside the channel of the device, so that the self-heating effect of the device is alleviated.

In an embodiment, the substrate layer 100 is made of silicon. The source electrode 400 and the drain electrode 500 are independently made of a metal material. The gate electrode 700 is made of polysilicon. And the gate dielectric layer 600 is made of silicon dioxide.

The heat conduction column 800 penetrates through the buried oxide layer 200 along a thickness direction of the buried oxide layer 200. In an embodiment, the thickness direction of the buried oxide layer 200 is parallel to the top wall of the heat conduction column 800, and is parallel to a side wall of the gate dielectric layer 600 connected to the source electrode 400. Referring to FIG. 1, the thickness direction of the buried oxide layer 200 is a direction from an outside of FIG. 1 to an inside of FIG. 1.

The heat conduction column 800 is made an III-V compound semiconductor material. In an embodiment, the heat conduction column 800 is made of SiC, GaN, InN or AlN. In this embodiment, the heat conduction column 800 is made SiC. In an embodiment, a heat conductivity coefficient of SiC is high, so that the heat conduction column 800 can more reliably and quickly dissipate the heat below the active zone 300. Such addition of SiC heat conduction column 800 enhances the heat dissipation of the device in a vertical direction, which reduces an accumulation of the heat in the active zone 300, eliminates a peak of the electric field at an edge of the gate electrode 700, and increases a breakdown voltage of the drain electrode 500 of the device.

Figure 12:
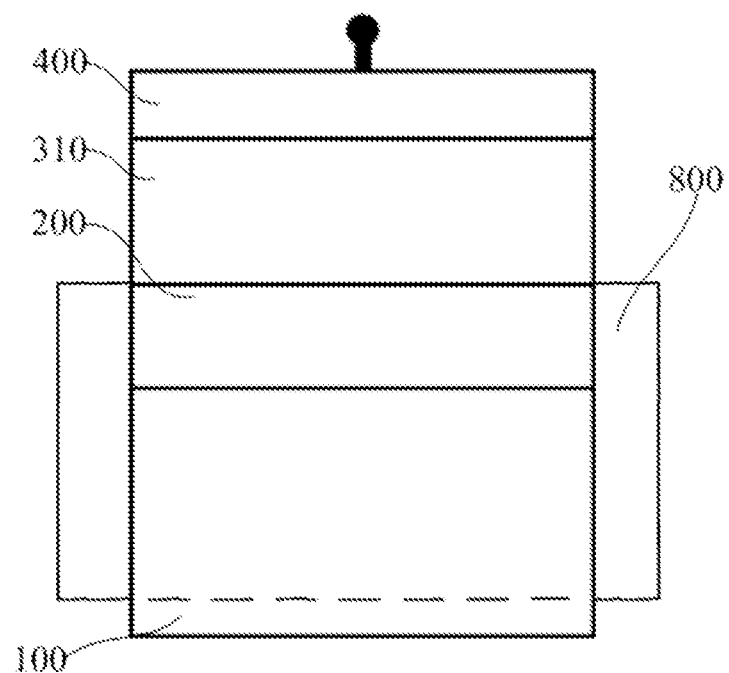
FIG. 12 is a left side view of the SOI MOSFET structure according to an embodiment of the present disclosure.

Referring to FIG. 12, two ends of the heat conduction column 800 penetrate through the buried oxide layer 200. And the two ends of the heat conduction column 800 extend out the buried oxide layer 200, penetrate through an isolation layer and are connected to a heat conduction column of another device until extend to an edge of a substrate layer of a chip. In an embodiment, in such setting, the heat conduction column is configured to connect a column of MOS tubes of the chip, which can realize accelerating transverse heat dissipation of the chip. However, the two ends of the heat conduction column 800 do not penetrate the substrate layer of the chip, such design of the chip has stronger mechanical reliability, more easy process realization, and more simple process.

Referring to FIG. 1, a central axis of the heat conduction column 800 is located directly below a side wall of the gate electrode 700 close to the drain electrode 500, and is located at the same vertical line with the side wall of the gate electrode 700 close to the drain electrode 500. In an embodiment, an area with a highest temperature in the active zone 300 is below the side wall of gate electrode 700 close to drain electrode 500, so that the heat conduction column 800 is located directly below the area with the highest temperature in the active zone 300, and is in contact with the area with the highest temperature in the active zone 300, in such setting, the heat conduction column 800 can quickly dissipate the heat from the area with the highest temperature in the active zone 300.

The notch 710 penetrates through the gate electrode 700 along a thickness direction of the gate electrode 700. In an embodiment, the thickness direction of the gate electrode 700 is parallel to the thickness direction of the buried oxide layer 200. Referring to FIG. 1, the thickness direction of the gate electrode 700 is the direction from the outside of FIG. 1 to the inside of FIG. 1.

Figure 3:
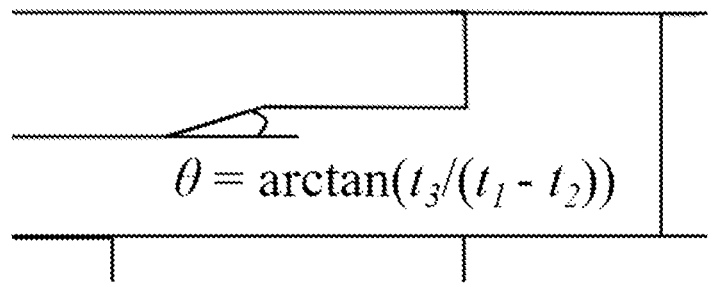
FIG. 3 is an enlarged view of portion "B" in FIG. 2.

Referring to FIGS. 2-3, the notch 710 includes the upper bottom surface, a first side surface, the lower bottom surface, and a second side surface connected in sequence. The upper bottom surface of the notch is parallel to the lower bottom surface of the notch. The first side surface of the notch is a side of the notch 710 close to the drain electrode 500, and the second side surface of the notch is a side of the notch 710 close to the source electrode 400. A length of the lower bottom surface of the notch is denoted as $t_1$, a length of the upper bottom surface of the notch is denoted as $t_2$, and a height of the notch is denoted as $t_3$. An angle between the second side surface of the notch and the lower bottom surface is denoted as θ, and the θ is expressed as: θ=arctan($t_3/(t_1-t_2)$), and is not greater than 90°. In an embodiment, in the above range, the greater the angle θ, the more obvious the cooling effect of active zone 300. In this embodiment, the range of the angle θ is within 36°-90°.

Figure 8:
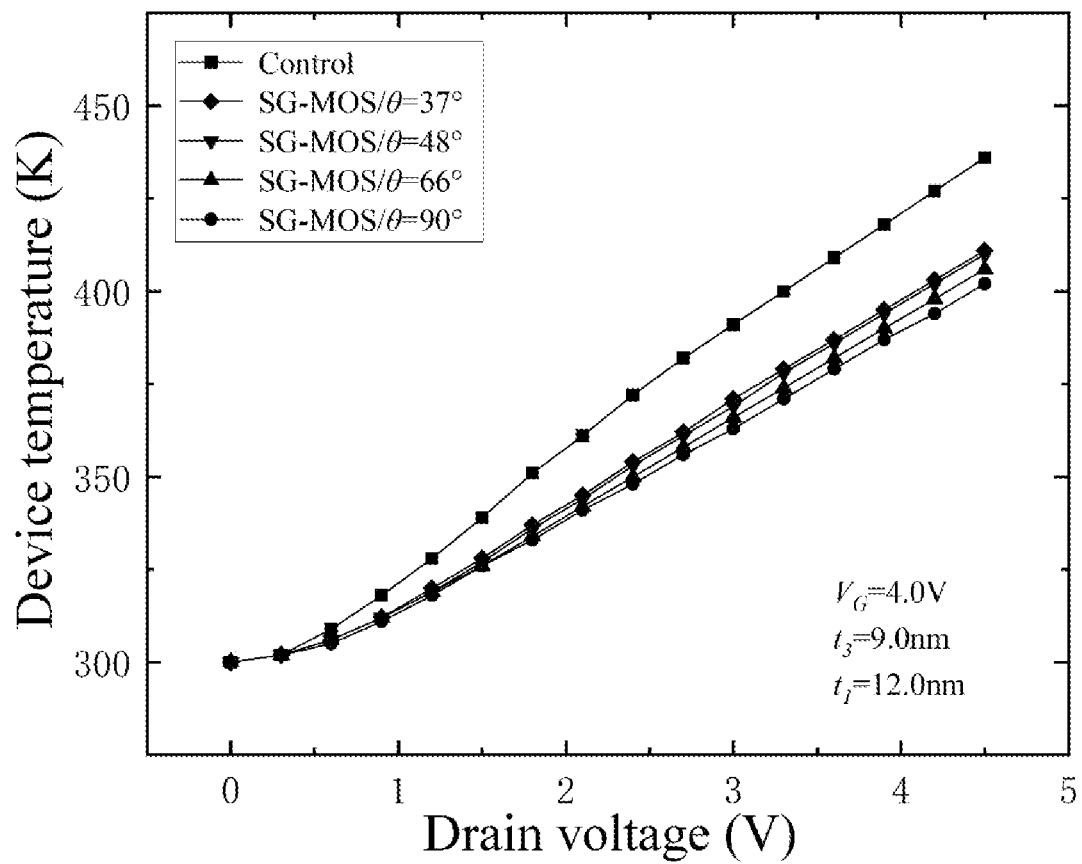
FIG. 8 shows changes of a temperature rise of devices of an inclined gate structure under different angles θ according to an embodiment of the present disclosure.

Referring to FIG. 8, FIG. 8 shows changes of a temperature rise of devices of an inclined gate structure under different angles θ. By setting the inclined gate structure in the present disclosure, the temperature rise of the device is obviously lower than that of the standard device in the prior art, and the cooling effect of the device is more obvious with the increase of the angle θ.

Referring to FIGS. 1-2, the active zone 300 includes a first N-type heavily doped region 310, a P-type doped region 320 and a second N-type heavily doped region 330 connected in sequence. The first N-type heavily doped region 310 is located below the source electrode 400 and the gate dielectric layer 600. The second N-type heavily doped region 330 is located below the drain electrode 500 and the gate dielectric layer 600. The P-type doped region 320 is located below the gate dielectric layer 600. The first N-type heavily doped region 310 and the second N-type heavily doped region 330 are independently formed by a first N-type semiconductor, where the first N-type semiconductor is made of a pentavalent element-doped silicon material. And the P-type doped region 320 is formed by a P-type semiconductor, where the P-type semiconductor is made of a trivalent element-doped silicon material. A pentavalent element can be arsenic, phosphorus or antimony. A trivalent element can be boron, gallium, aluminum or indium. In an embodiment, an upper wall of the first N-type heavily doped region 310 is connected with the source electrode 400 and the gate dielectric layer 600 respectively. An upper wall of the P-type doped region 320 is connected with the gate dielectric layer 600. And an upper wall of the second N-type heavily doped region 330 is connected with the drain electrode 500 and the gate dielectric layer 600 respectively. In this embodiment, the first N-type heavily doped region 310, the second N-type heavily doped region 330 and the P-type doped region 320 are in an integrated structure, which is formed by different doping of bulk silicon in three regions.

The N-type semiconductor is also known as an electronic semiconductor, and the N-type semiconductor is a doped semiconductor that a concentration of free electrons is much greater than a concentration of holes. The P-type semiconductor is also known as a hole semiconductor, and the P-type semiconductor is a doped semiconductor that a concentration of holes is much greater than a concentration of free electrons.

Referring to FIG. 2, an N-type lightly doped region 321 is provided in the P-type doped region 320. The N-type lightly doped region 321 is in contact with the gate dielectric layer 600. The N-type lightly doped region 321 is formed by a second N-type semiconductor, and a pentavalent element doping level in the N-type lightly doped region 321 is lower than that in the first N-type heavily doped region 310 and the second N-type heavily doped region 330. In an embodiment, a doping range of the N-type lightly doped region 321 is 0-1.3×10$^{18}$ cm$^{-3}$. After the N-type lightly doped region 321 is provided in the P-type doped region 320, carriers (electrons) in the P-type doped region 320 are increased, so that a current in the P-type doped region 320 of the active zone 300 is increased, and the current of the drain electrode 500 of the device is increased. And the N-type lightly doped region 321 is set in the P-type doped region 320, that is, the light doping of the channel is carried out.

Figure 11:
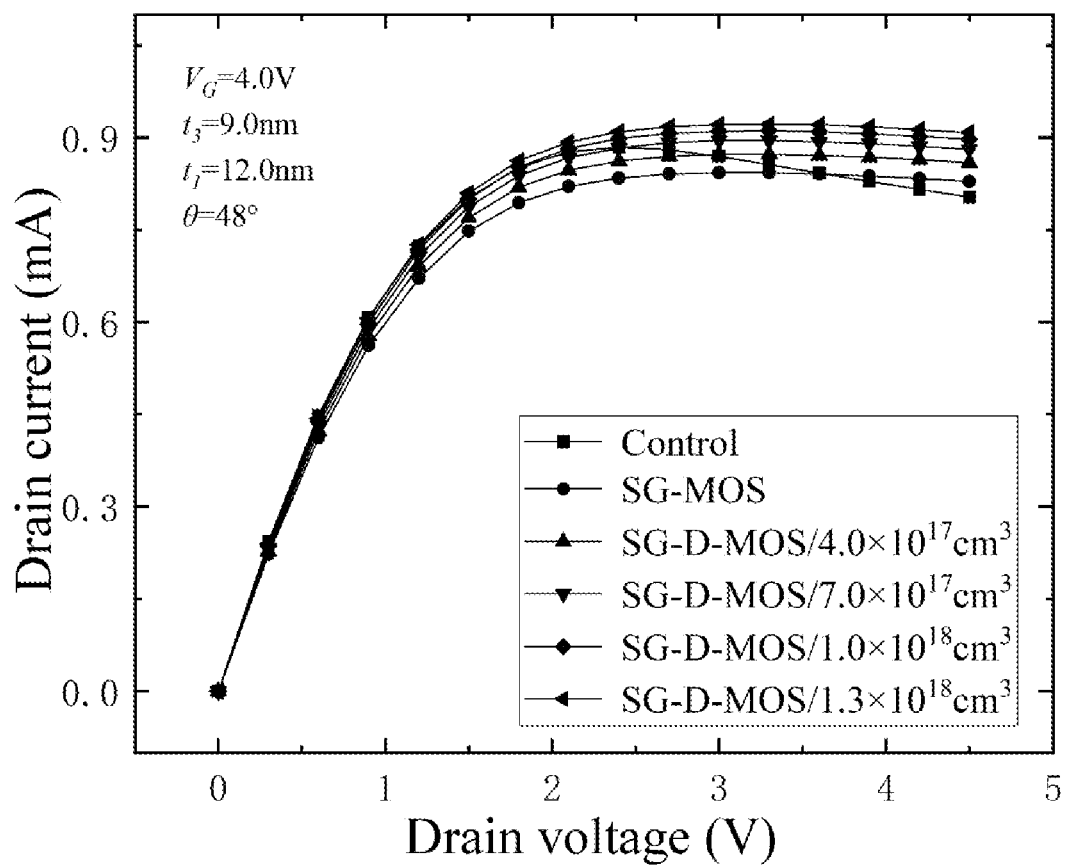
FIG. 11 shows output curves of the devices according to an embodiment of the present disclosure under different doping concentrations of the light doping of the channel.

In an embodiment, referring to FIG. 11, FIG. 11 shows output curves of the devices under different doping concentrations of the light doping of the channel. The output characteristic curves show the N-type lightly doped region 321 with doping concentrations of 4.0×10$^{17}$ cm$^{-3}$, 7.0×10$^{17}$ cm$^{-3}$, 1.0×10$^{18}$ cm$^{-3}$ and 1.3×10$^{18}$ cm$^{-3}$ are set in the P-type doped region 320, which shows that saturation currents of the devices are significantly increased after the light doping of the channel, and increase as the increase of the doping concentration.

When a voltage is applied to the gate electrode 700, a channel is formed at a top of the P-type doped region 320, so that the source electrode 400 and the drain electrode 500 are communicated through the first N-type heavily doped region 310, a channel of the P-type doped region 320 and the second N-type heavily doped region 330.

In an embodiment, the light doping and the heavy doping are relative. A concentration ratio of doping and semiconductor atoms in heavily doped semiconductors is about one in a thousand, while a concentration ratio of doping and semiconductor atoms in lightly doped semiconductors may be one in a billion.

Referring to FIGS. 1-2, the N-type lightly doped region 321 is located directly below the gate electrode 700.

The present disclosure has the following beneficial effects. Owing to a composite structure is adopted in the present disclosure, especially on a problem of reducing the self-heating effects, a temperature of the device can be minimized by reducing the heat production of the SOI MOSFET structure (caused by the notch 710 of the gate electrode 700) and enhancing the heat dissipation of the device (caused by the SiC heat conduction column 800), so that the highest temperature of the device is decreased from 436.0K to 365.2K, which is a decrease of 16.2%, and the current of the drain electrode 500 (caused by the inclined gate structure and its channel local doping) and the breakdown voltage are increased (caused by the SiC heat conduction column 800).

Figure 4:
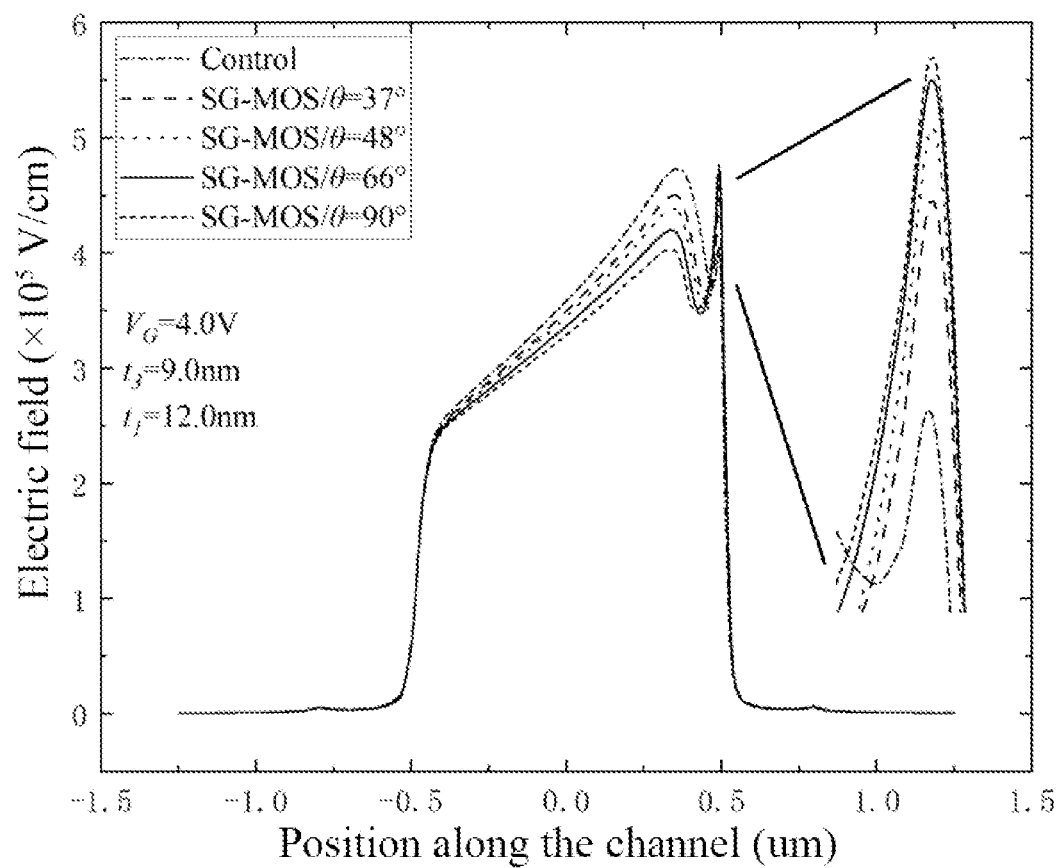
FIG. 4 shows changes of a channel electric field along a channel horizontal direction of a SG-MOS device at different angles θ according to an embodiment of the present disclosure.

In an embodiment, referring to FIG. 4, a gate voltage $V_G$=4.0V and parameters $t_1$=12 nm, $t_3$=9 nm of the device are set. FIG. 4 shows changes of a channel electric field along a channel horizontal direction of P-type doped region 320 under different angles θ of the gate electrode 700 and the notch 710 simulated by COMSOL software. As the angles θ of the gate electrode 700 and the notch 710 increase, the channel electric field is gradually decreased, so as to reduce the heat production of the SOI MOSFET structure. However, a setting of the gate electrode 700 and the notch 710 will cause a peak value of the channel electric field to be greater than that of the prior art. In addition, referring to FIG. 7, the present disclosure further provides the SiC heat conduction column 800 to eliminate the above peak value of the channel electric field.

Figure 5:
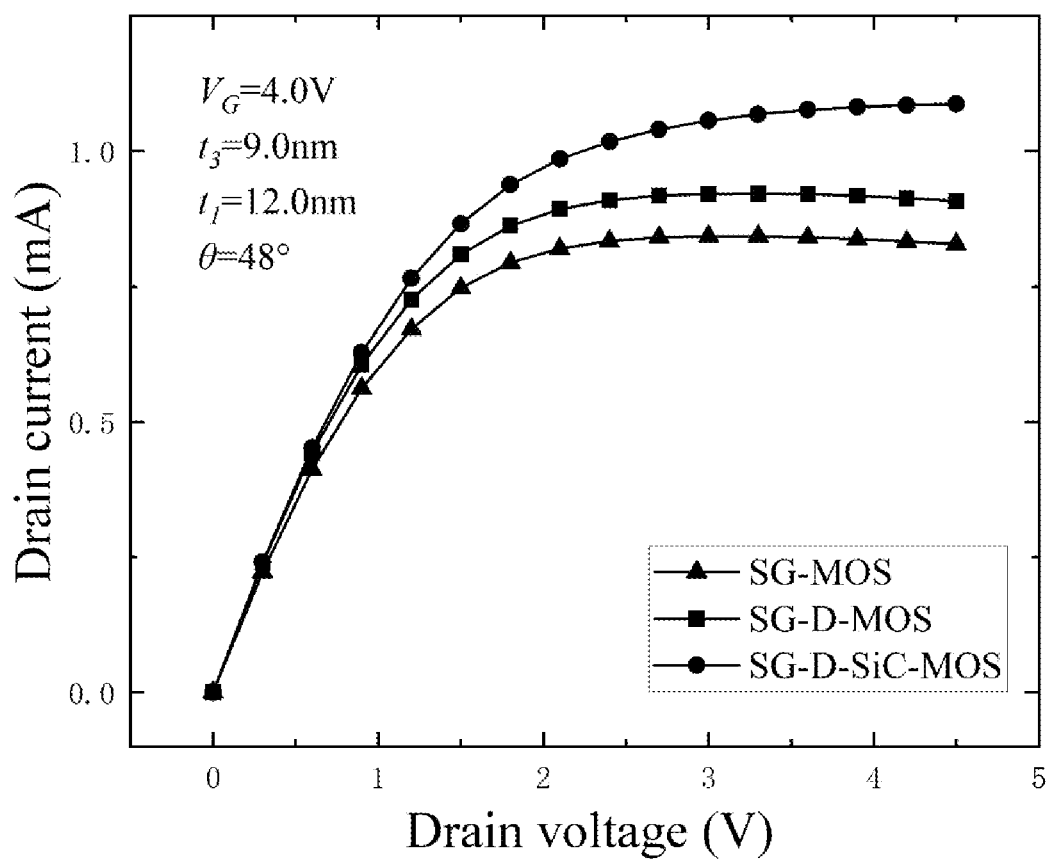
FIG. 5 shows changes of a drain current of the SOI MOSFET structure as increase of applied voltages of a drain electrode according to an embodiment of the present disclosure.

Referring to FIG. 5, FIG. 5 shows current changes of the SOI MOSFET structure as increase of applied voltages of the drain electrode 500. Compared to the prior art, the present disclosure avoids current reduction of the SOI MOSFET structure when the voltage is too high through setting the notch 710 of gate electrode 700, but a peak value of the current is also reduced. The present disclosure further provides the P-type doped region 320 to not only avoid the current reduction of the SOI MOSFET structure when the voltage is too high, but also avoid the reduction of the peak value of the current. And the present disclosure further provides the SiC heat conduction column 800 to not only avoid the current reduction of the SOI MOSFET structure when the voltage is too high, but also increase the reduction of the peak value of the current.

Figure 6:
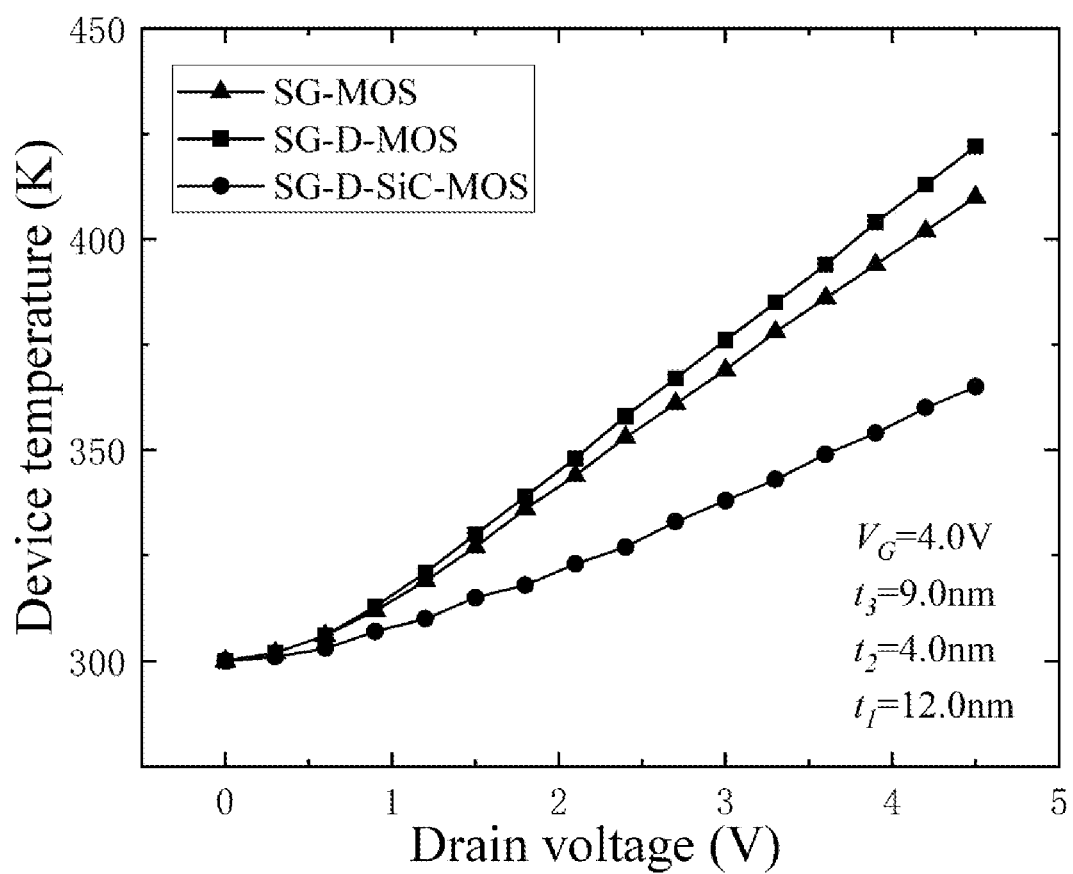
FIG. 6 shows changes of a temperature of the SOI MOSFET structure as increase of the applied voltages of the drain electrode according to an embodiment of the present disclosure.

Referring to FIG. 6, FIG. 6 shows changes of the temperature of the SOI MOSFET structure as increase of the applied voltages of the drain electrode 500. Compared to the prior art, the present disclosure provides the notch 710 of the gate electrode 700 to decreased the temperature of the SOI MOSFET structure. The present disclosure further provides the P-type doped region 320 to further decrease the temperature of the SOI MOSFET structure. And the present disclosure further provides the SiC heat conduction column 800 to further decrease the temperature of the SOI MOSFET structure.

Figure 7:
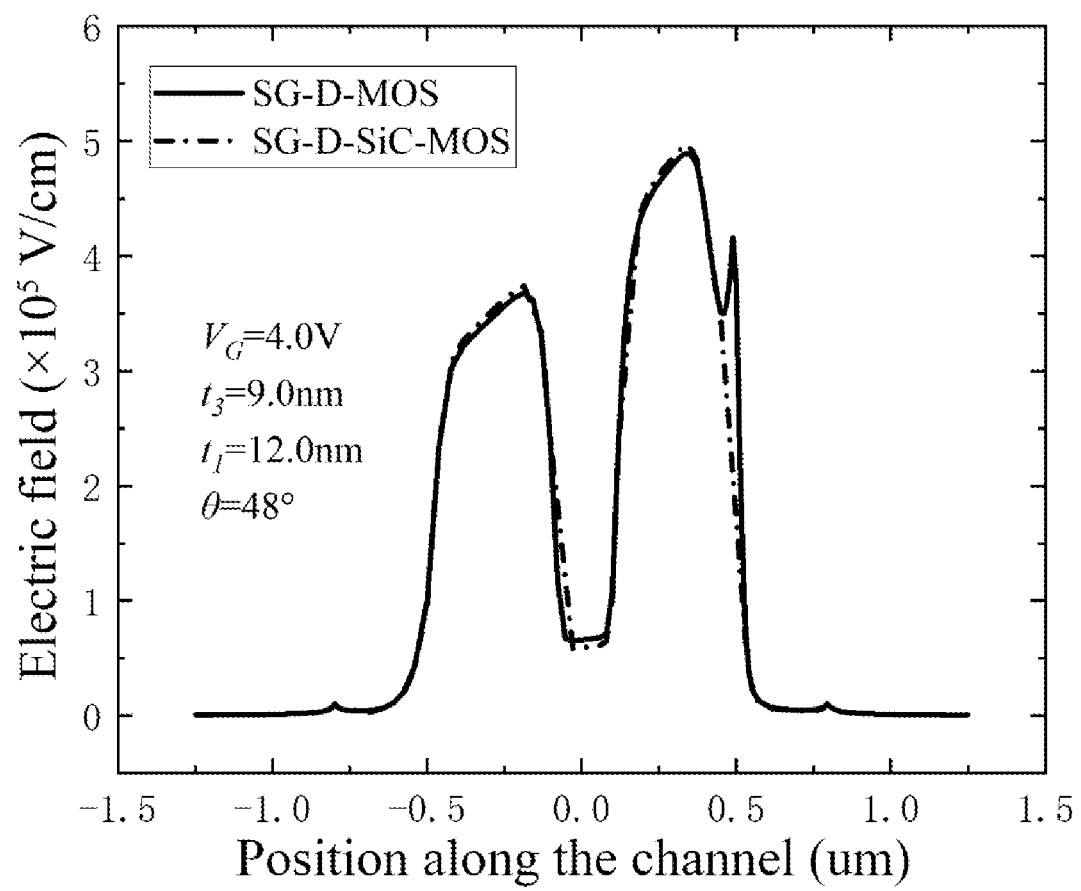
FIG. 7 shows changes of the channel electric field along channel horizontal directions of devices under different structures according to an embodiment of the present disclosure.

Referring to FIG. 7, shows changes of the channel electric field along a channel direction of the P-type doped region 320.

Figure 9:
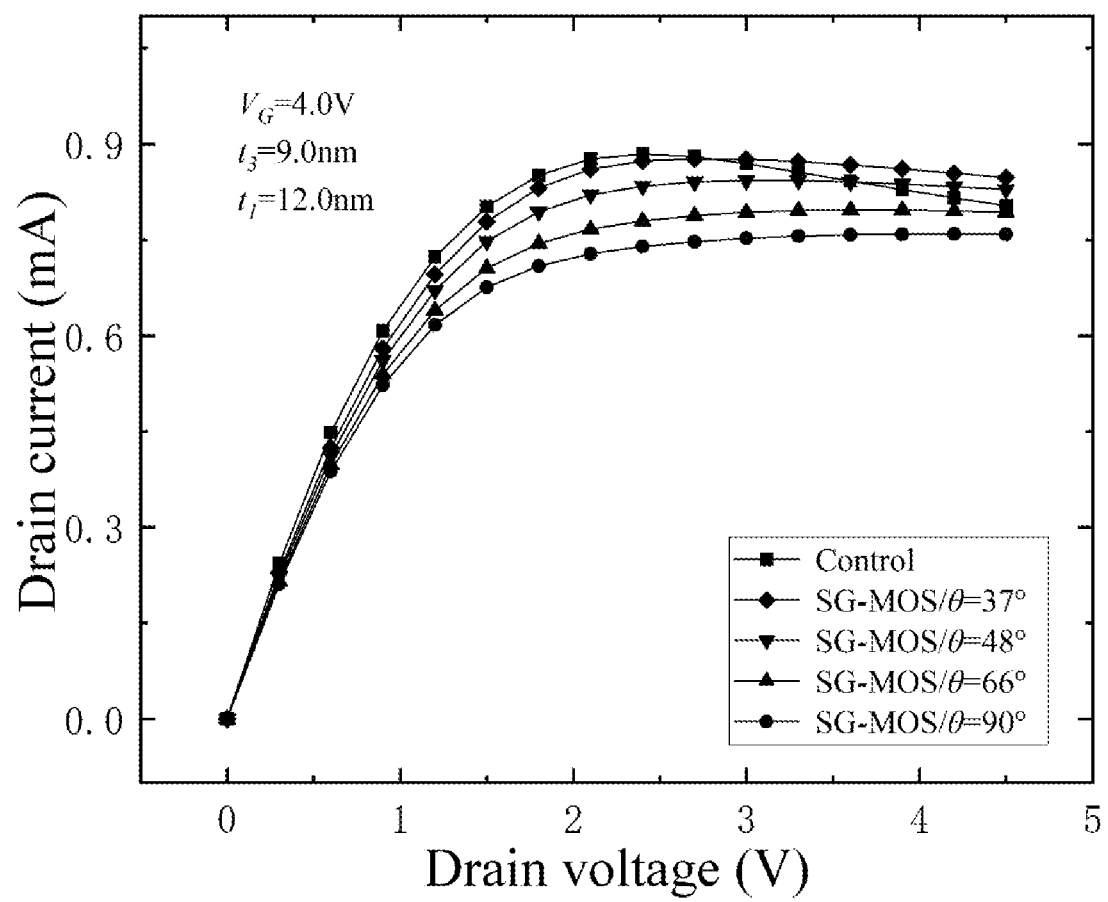
FIG. 9 shows output curves of the devices of the inclined gate structure under different angles θ according to an embodiment of the present disclosure.

Referring to FIG. 9, FIG. 9 shows output curves of the devices of the inclined gate structure under different angles θ. The present disclosure provides the inclined gate structure to significantly increase the statured current of the device. And the statured current increases with a decrease of the angles θ.

Figure 10:
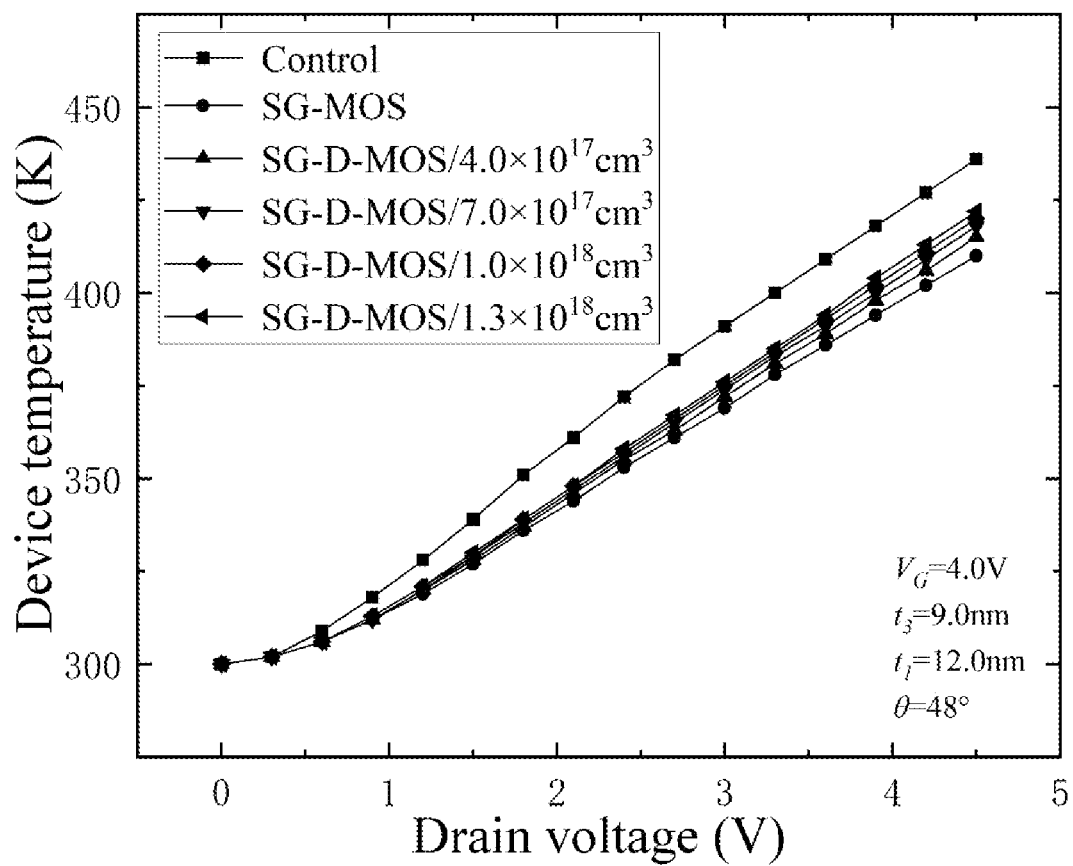
FIG. 10 shows changes of the temperature rise of devices according to an embodiment of the present disclosure under different doping concentrations of the light doping of the channel.

Referring to FIG. 10, FIG. 10 shows changes of the temperature rise of the devices under different doping concentrations of the light doping of the channel, which shows that the temperature rise of the devices is significantly decreased after the light doping of the channel, and decreases with an increase of the doping concentrations.

Described above are only preferred embodiments of this application, and are not intended to limit the scope of this application. Any equivalent replacements or direct/indirect application on other arts without departing from the spirit of this application shall fall within the scope of this application defined by the appended claims.

What is claimed is:

1. A silicon-on-insulator metal-oxide-semiconductor field-effect transistor (SOI MOSFET) structure, comprising:
   a substrate layer;
   a buried oxide layer;
   an active zone;
   a source electrode;
   a drain electrode;
   a gate dielectric layer;
   a gate electrode; and
   a heat conduction column;
   wherein the buried oxide layer is arranged on an upper surface of the substrate layer, and is made of $SiO_2$; the active zone is arranged on an upper surface of the buried oxide layer; the source electrode and the drain electrode are arranged on an upper surface of the active zone, and the source electrode is spaced from the drain electrode; the gate dielectric layer is arranged on the upper surface of the active zone; a first end of the gate dielectric layer is connected to the source electrode, and a second end of the gate dielectric layer is connected to the drain electrode; the gate electrode is provided in the gate dielectric layer, and is not in contact with the source electrode and the drain electrode; the heat conduction column penetrates through the buried oxide layer; a top wall of the heat conduction column is in contact with the active zone, and a bottom wall of the heat conduction column extends into the substrate layer; the gate electrode has a cuboid structure; a side of a bottom end of the gate electrode close to the drain electrode is provided with a notch, and the notch penetrates through the gate electrode; a central axis of the heat conduction column is located directly below a side wall of the gate electrode close to the drain electrode, and is located at the same vertical line with the side wall of the gate electrode close to the drain electrode.

2. The SOI MOSFET structure of claim 1, wherein the heat conduction column is made of an III-V compound semiconductor material.

3. The SOI MOSFET structure of claim 1, wherein the heat conduction column is made of SiC, GaN, InN or AlN.

4. The SOI MOSFET structure of claim 1, wherein two ends of the heat conduction column are configured to respectively penetrate through the buried oxide layer and extend out of the buried oxide layer to pass through an isolation layer to be connected to a heat conduction column of another device.

5. The SOI MOSFET structure of claim 1, wherein the notch comprises an upper bottom surface, a first side surface, a lower bottom surface, and a second side surface connected in sequence; the upper bottom surface of the notch is parallel to the lower bottom surface of the notch; the first side surface of the notch is a side of the notch close to the drain electrode, and the second side surface of the notch is a side of the notch close to the source electrode; a length of the lower bottom surface of the notch is denoted as $t_1$, a length of the upper bottom surface of the notch is denoted as $t_2$, a height of the notch is denoted as $t_3$; an angle between the second side surface of the notch and the lower bottom surface of the notch is denoted as θ, and the θ is expressed as: $θ=\arctan(t_3/(t_1-t_2))$, and is not greater than 90°.

6. The SOI MOSFET structure of claim 1, wherein the active zone comprises a first N-type heavily doped region, a P-type doped region and a second N-type heavily doped region connected in sequence; the first N-type heavily doped region is located below the source electrode and the gate dielectric layer; the second N-type heavily doped region is located below the drain electrode and the gate dielectric layer; the P-type doped region is located below the gate dielectric layer; the first N-type heavily doped region and the second N-type heavily doped region are independently formed by a first N-type semiconductor, wherein the first N-type semiconductor is made of a pentavalent element-doped silicon material; and the P-type doped region is formed by a P-type semiconductor, wherein the P-type semiconductor is made of a trivalent element-doped silicon material.

7. The SOI MOSFET structure of claim 6, wherein an N-type lightly doped region is provided in the P-type doped region; the N-type lightly doped region is in contact with the gate dielectric layer; the N-type lightly doped region is formed by a second N-type semiconductor; and a pentavalent element doping level in the N-type lightly doped region is lower than that in the first N-type heavily doped region and the second N-type heavily doped region.

\* \* \* \* \*